United States Patent [19]

Voorman

[11] Patent Number: 4,786,880

[45] Date of Patent: Nov. 22, 1988

[54] FILTER ARRANGEMENT

[75] Inventor: Johannes O. Voorman, Eindhoven, Netherlands

[73] Assignee: U.S. Philips Corporation, New York, N.Y.

[21] Appl. No.: 33,140

[22] Filed: Mar. 31, 1987

[30] Foreign Application Priority Data

Nov. 14, 1986 [NL] Netherlands ............ 8602893

[51] Int. Cl.$^4$ .............................. H03F 1/34
[52] U.S. Cl. ..................................... 330/294; 330/109
[58] Field of Search ............ 330/107, 109, 294, 252, 330/267, 273

[56] References Cited

U.S. PATENT DOCUMENTS 4,509,019  4/1985  Banu et al. ............ 330/107

Primary Examiner—Gene Wan
Attorney, Agent, or Firm—Steven R. Biren

[57] ABSTRACT

In a filter arrangement, a first junction capacitor is arranged between the inverting output and the non-inverting input of a fully balanced amplifier and a second junction capacitor is arranged between the non-inverting output and the inverting input. Additionally, a first resistor is arranged between a first input terminal and the non-inverting input and a second resistor is arranged between a second input terminal and the inverting input. A first current source is connected to the non-inverting input and a second current source is connected to the inverting input. The current sources produce the reverse voltages for the junction capacitors across the resistors to define the capacitance values of these capacitors.

9 Claims, 3 Drawing Sheets

FILTER ARRANGEMENT

BACKGROUND OF THE INVENTION

The invention relates to a filter arrangement comprising a balanced amplifier having an inverting input, a non-inverting input, an inverting output and a non-inverting output, at least a first input circuit arranged between a first input terminal and the inverting input, at least a second input circuit arranged between a second input terminal and the non-inverting input, a first feedback circuit arranged between the non-inverting output and the inverting input, and a second feedback circuit arranged between the inverting output and the non-inverting input, which first and second input circuit each comprise a substantially identical first circuit element, which first and second feedback circuits each comprise a substantially identical second circuit element, one of said two circuit elements being a capacitor and the other circuit element being a resistor and the magnitude of at least one of said two circuit elements being adjustable.

Such a filter arrangement may be employed in, for example filters, oscillators and resonators.

Such a filter arrangement is known from U.S. Pat. No. 4,509,019. In said arrangement one circuit element is constituted by a capacitor having a fixed capacitance and the other circuit element is constituted by a resistor formed by a MOS transistor whose resistance value can be adjusted by means of a control voltage applied to its gate electrode. By means of this control voltage the RC-time constant of the resistor and the capacitor can be adjusted to the desired value. The capacitors may be arranged in the feedback circuits and the resistors in the input circuits or the capacitors may be arranged in the input circuits and the resistors in the feedback circuits. In the first case the filter circuit constitutes an integrator or low-pass filter and in the second case it constitutes a differentiator or high-pass filter.

A balanced input voltage is applied to the first and the second input terminal of the filter arrangement and a balanced output voltage is available on the inverting and the non-inverting output of the amplifier. This output voltage is substantially free of even-order harmonic distortion, which is inter alia caused by non-linearities of the MOS resistors. This is because these harmonic components cancel one another as a result of the symmetrical construction of the arrangement and the balanced drive.

A drawback of this known arrangement is that it can be realized only by means of a semiconductor process enabling MOS transistors to be fabricated. The arrangement cannot be realized by means of a purely bipolar process. Therefore, it is the object of the invention to provide a balanced filter arrangement with a variable RC-time constant which can also be fabricated by means of a bipolar process.

SUMMARY OF THE INVENTION

According to the invention an arrangement of the type defined above is characterized in that one element is constituted by a junction capacitor and in that a bias-current source is connected to the inverting input and to the non-inverting input for adjusting the capacitance of the junction capacitor connected to the relevant input. In the filter arrangement in accordance with the invention use is made of junction capacitors whose capacitance can be varied to adjust the time constant of the arrangement. In a bipolar process such junction capacitors are formed by a reverse-biassed semiconductor junction (PN-junction), the capacitance depending on the voltage across this junction. In the filter arrangement in accordance with the invention this capacitance can be adjusted by means of a bias-current source which produces the bias voltage for the junction capacitor across resistors connected to the relevant input. It has been found that distortions in the arrangement produced as a result of non-linearities of the junction capacitors are compensated for in the same way as those caused by the MOS resistors in the known arrangement.

It is to be noted that the invention is not limited to a filter arrangement which can be fabricated exclusively by means of a bipolar process. The filter arrangement in accordance with the invention may also be fabricated by means of processes employing both bipolar and MOS circuit elements, such as BIMOS and BICMOS processes. This enables the junction capacitors to be fabricated in bipolar technology and the resistors to be constructed for example as MOS resistors.

Am embodiment of a filter arrangement in accordance with the invention may be characterized in that the first circuit element is a resistor and the second circuit element is a junction capacitor. The arrangement then constitutes an integrator. Generally, the arrangement will be constructed as such an integrator. However, in principle it is also possible to construct the arrangement as a differentiator, the resistors then being arranged in the feedback circuits and the junction capacitors in the input circuits.

A suitable embodiment of the filter arrangement in accordance with the invention may be characterized in that the amplifier comprises two transistors of a first conductivity type which are arranged as a differential pair and which have their bases coupled to the non-inverting input and the inverting input of the amplifier and their collectors to the inverting output and the non-inverting output of the amplifier, between which outputs a load circuit is arranged, which load circuit comprises a first and a second current-source transistor of a second conductivity type, whose collectors are connected to the non-inverting output and the inverting output, whose bases are connected to a common control input which is coupled to the junction point between two load resistors which are arranged between the non-inverting output and the inverting output of the amplifier. This simple amplifier supplies a balanced output signal current which is large relative to the balanced input signal, so that the amplifier has a satisfactory signal-to-noise ratio. The load circuit ensures that the direct voltage on the outputs is accurately defined, so that the output signal remains fully balanced.

The resistors, which are arranged in the input circuits of the filter arrangement when their arrangement is constructed as an integrator, may have comparatively large values. It is known that such resistors when integrated give rise to an undesired phase shift of the signal owing to parasitic capacitances between these resistors and the underlying layer, for example the substrate of the integrated circuit. As a result of the parasitic capacitances the resistors behave as distributed RC networks. In practice the filter arrangement will be used in circuits comprising a plurality of such coupled filter arrangements. In that case the undesired effects of parasitic capacitances can be avoided in that the filter arrangement in accordance with a further embodiment of the invention is characterized in that the input terminals of a second filter arrangement are connected to the outputs of the first filter arrangement and in that a resistor arranged in an input circuit of the second filter arrangement and the load resistor which forms part of the first filter arrangement and which is connected to said resistor are integrated in one semiconductor body respectively as a diffused resistor and a buried resistor arranged in parallel therewith. The parasitic capacitances are now present between the diffused resistor and the buried resistor. Across these two resistors the same signal voltage appears, so that no signal voltage is present across the parasitic capacitances. As a result of this, the parasitic capacitances of the resistor cannot adversely affect the operation of the arrangement.

In yet another embodiment the undesired effects of the parasitic capacitances can be compensated for if the filter arrangement is characterized in that a compensation capacitor is arranged in parallel with the resistors in the input circuits or the feedback circuits. This embodiment may be characterized further in that a compensation resistor is arranged in series with the compensation capacitor. This compensation may be employed both in the case of diffused bipolar resistors and in the case of MOS resistors. In the case of MOS transistors this compensation mainly compensates for the parasitic gate-substrate capacitance.

BRIEF DESCRIPTION OF THE DRAWING

Embodiments of the invention will now be described in more detail, by way of example, with reference to the accompanying drawings, in which:

FIGS. 3b to 3e show several examples of a part of the circuit arrangement shown in FIG. 3a.

DESCRIPTION OF THE PREFERRED EMBODIMENTS

Figure 1A:
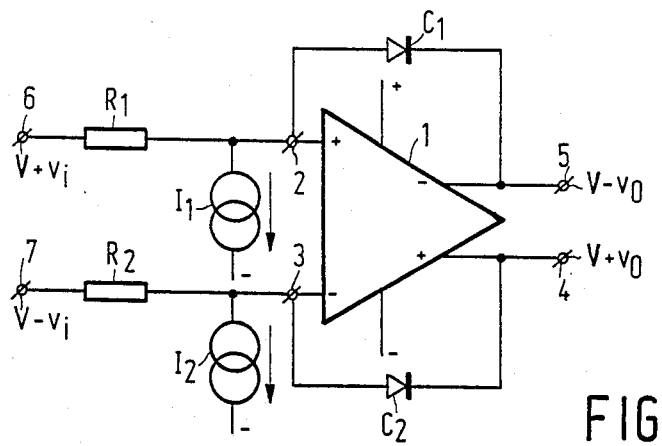
FIGS. 1a–1c shows several basic diagrams of filter arrangements in accordance with the invention.

FIG. 1a shows a first basic diagram of a filter arrangement in accordance with the invention constructed as an integrator. The filter arrangement comprises a balanced amplifier 1 which is arranged between a positive and a negative power-supply terminal and which comprises a non-inverting input 2, an inverting input 3, a non-inverting output 4 and an inverting output 5. A first input circuit comprising a resistor $R_1 = R$ is arranged between the first input terminal 6 and the non-inverting input 2 and a second input circuit comprising a resistor $R_2$ identical to the resistor $R_1$ is arranged between a second input terminal 7 and the inverting input 3. A first feedback circuit comprising a first junction capacitor $C_1$ is arranged between the inverting output 5 and the non-inverting input 2 and a second feedback circuit comprising a junction capacitor $C_2$ identical to the first junction capacitor is arranged between the non-inverting output 4 and the inverting input 3. Further, a first current source $I_1 = I$ is arranged between the non-inverting input 2 and the power-supply terminal and a second current source $I_2$ identical to the first current source is arranged between the inverting input 3 and the negative power-supply terminal.

As is known per se, the junction capacitors $C_1$ and $C_2$ are constituted by reverse-biassed semiconductor junctions (PN-junctions), the capacitance depending on inter alia the reverse voltage across the junction. This reverse voltage is defined by the current sources $I_1$ and $I_2$. It is assumed that the direct voltages on the inputs 6 and 7 and the outputs 4 and 5 are equal to each other. If the operation of the current source is ignored, the non-inverting input 2 and the inverting input 3 are also at the same direct voltage. In that case no direct voltage is present across the junction capacitors $C_1$ and $C_2$. However, across the resistor $R_1$ the current source $I_1$ produces a voltage which is equal to $V_c = IR$. This voltage then also appears across the capacitor $C_1$ and also determines its capacitance. In the same way the current source $I_2$ defines the voltage across the capacitor $C_2$. By constructing the current sources $I_1$ and $I_2$ as variable-current sources, the RC-time constant of the arrangement can be adjusted accurately. The manner in which such an adjustment is effected falls beyond the scope of the present Application and is therefore not described herein. For this, reference is made to the article "Continuous-Time MOS-FET-C Filters in VLSI" in IEEE Jnl. of SolidState Circuits, Vol. SC-21, No. 1, February '86, pp. 15–29, in which a number of such adjustments are described.

The junction capacitors $C_1$ and $C_2$ exhibit non-linearities, causing distortion of the output signal. As a result of the symmetrical construction of the arrangement and the balanced drive of this arrangement these distortions are found to cancel one another in the arrangement. Thus, the range in which the balanced output signal increases as a linear function of the balanced input voltage is extended.

Figure 1B:
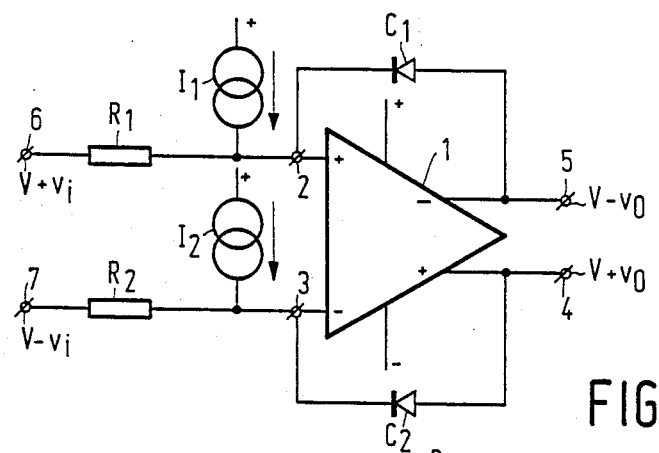

FIG. 1b shows a second basic diagram of a filter arrangement in accordance with the invention constructed as an integrator, identical parts bearing the same reference numerals as in FIG. 1a. In the arrangement shown in FIG. 1b the cathodes of junction capacitors $C_1$ and $C_2$ are connected to the non-inverting input 2 and the inverting input 3 of the amplifier 1 instead of the anodes, as in the arrangement of FIG. 1a. The current sources $I_1$ and $I_2$ are now connected to the positive power-supply terminal instead of to the negative power-supply terminal. Across the resistors $R_1$ and $R_2$ the current sources $I_1$ and $I_2$ produce a voltage which is an amount $V_c = IR$ higher than the voltage on the inputs 6 and 7. Consequently, this voltage also appears across the junction capacitors $C_1$ and $C_2$ and thus also determines the capacitance values of these capacitors. Further, the arrangement is identical to that shown in FIG. 1a.

Figure 1C:
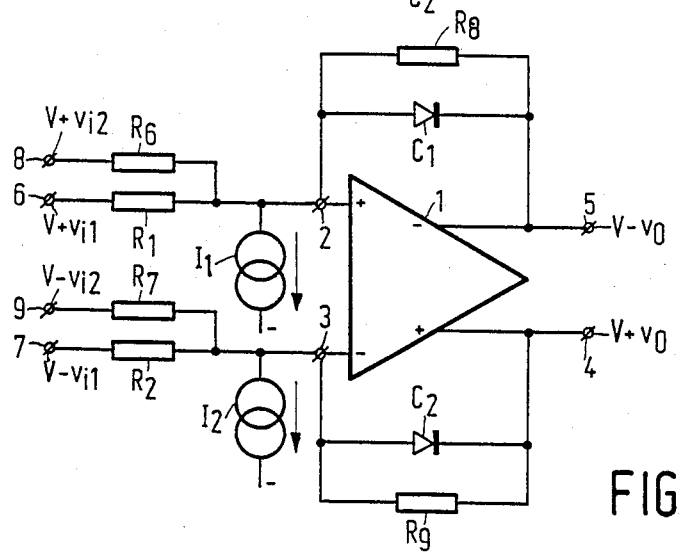

FIG. 1c shows a third basic diagram of a filter arrangement in accordance with the invention constructed as an integrator, identical parts again bearing the same reference numerals as in FIG. 1a. In addition to a first and a second input circuit the arrangement further comprises a third input circuit arranged between a third input terminal 8 and the non-inverting input 2 and comprising a resistor $R_6$ and a fourth input circuit arranged between a fourth input terminal 9 and the inverting input 3 and comprising a resistor $R_7$ identical to the resistor $R_6$. A second balanced input signal $+V_{i2}$, $-v_{i2}$ is applied to the input terminals 8 and 9. The first feedback circuit between the inverting output 5 and the non-inverting input 2 comprises the parallel arrangement of a junction capacitor $C_1$ and a resistor $R_8$ and the second feedback circuit between the non-inverting output 4 and the inverting input 3 comprises an identical parallel arrangement of a junction capacitor $C_2$ and a resistor $R_9$. The reverse voltage across the capacitor $C_1$, which also determines its capacitance, is equal to the voltage produced across the parallel arrangement of the resistors $R_1$, $R_6$ and $R_8$ by the current source $I_1$. Similarly, the reverse voltage across the capacitor is equal to the voltage produced across the parallel arrangement of the resistors $R_2$, $R_7$ and $R_9$ by the current source $I_2$.

As is shown in FIG. 1c a large number of input circuits may be connected to the non-inverting input 2 and the inverting input 3. In addition, the outputs of a number of such arrangements may be connected directly to these inputs. In all these cases the reverse voltages across the junction capacitors are determined by the voltage produced across the resistors connected to the relevant input of the amplifier by the relevant current source.

It is to be noted that, in principle, the arrangements shown in FIG. 1 may be constructed as differentiators, in which case the junction capacitors must be arranged in the input circuits and the resistors in the feedback circuits. In these cases the voltage produced across the resistors by the current sources forms the bias voltage for the junction capacitors, defining their capacitances.

Figure 2:
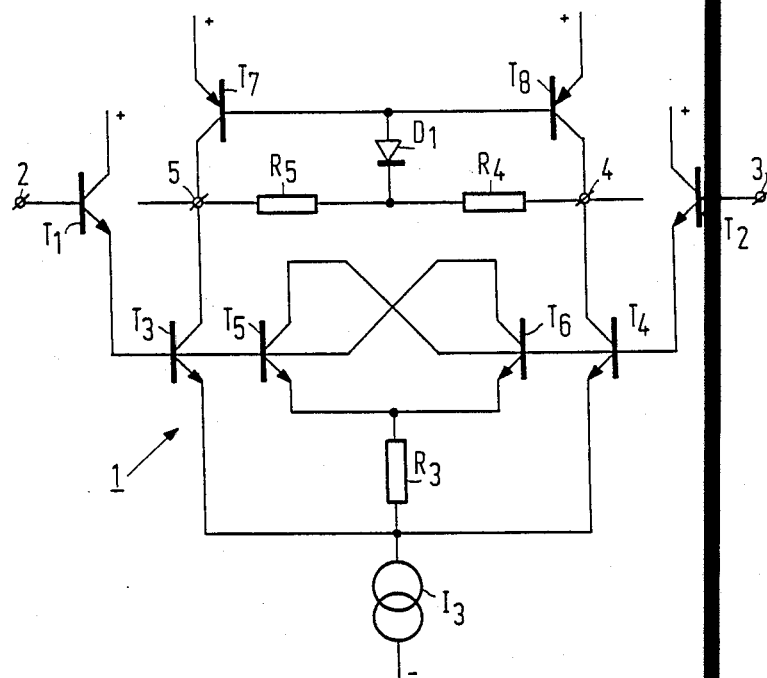
FIG. 2 shows an amplifier for use in the filter arrangements shown in FIG. 1.

FIG. 2 shows a suitable amplifier 1 for use in the filter arrangements of FIG. 1. The amplifier 1 comprises a differential pair of transistors $T_1$ and $T_2$ whose bases constitute the non-inverting input 2 and the inverting input 3, whose collectors are connected to the positive power-supply terminal, and whose emitters are connected to the bases of two transistors $T_5$ and $T_6$ which are arranged as a differential pair whose collectors are cross-coupled to the bases and whose emitters are connected to a current source $I_3$ via a common resistor $R_3$. Further, the amplifier comprises two transistors $T_3$ and $T_4$ arranged as a differential pair, whose bases are connected to the emitters of the transistors $T_1$ and $T_2$ and whose emitters are connected to the current source $I_3$. The collectors of the transistors $T_4$ and $T_3$ constitute the non-inverting output 4 and the inverting output 5 of the amplifier. Between the outputs 4 and 5 a load circuit is arranged, comprising a PNP transistor $T_7$ which has its emitter connected to the positive power-supply terminal, its collector to the output 5, and its base to the base of a PNP transistor $T_8$, whose emitter is connected to the positive power-supply terminal and whose collector is connected to the output 4. The common base of the transistors $T_7$ and $T_8$ is connected to junction point between two identical resistors $R_4$ and $R_5$ via a diode $D_1$, which resistors are arranged between the outputs 4 and 5. Instead of a diode, it is also possible to use a transistor whose base is at a reference voltage, or an operational amplifier having one input connected to the junction point between the resistors $R_4$ and $R_5$ and its other input to a reference-voltage source.

It is to be noted that this amplifier is the subject of patent application Ser. No. 033,127 filed simultaneously with the present application. In this respect it is observed only that the balanced input voltage applied to the bases 2 and 3 is converted into a balanced current by the differential pair $T_1$, $T_2$, the differential pair $T_5$, $T_6$ providing an increased slope of the arrangement. The differential pair $T_3$, $T_4$ provides additional current gain, which is defined by the value of the resistor $R_3$, which determines the ratio between the bias currents of the differential pair $T_3$, $T_4$ and the differential pair $T_5$, $T_6$. The load circuit maintains the direct voltage on the outputs 4 and 5 accurately. The transistors $T_7$ and $T_8$ compensate for the bias currents of the transistors $T_3$ and $T_4$, so that only the signal currents appear on the outputs 4 and 5. The resistors $R_4$ and $R_5$ have comparatively high resistance values, so that only a very small fraction of the signal current flows through these resistors and substantially the entire signal current is effectively available on the outputs 4 and 5. Since the signal current on the outputs 4 and 5 remains accurately balanced, no signal voltage will appear on the junction point between the resistors $R_4$ and $R_5$. Therefore, this junction point constitutes a virtual signal ground.

Figure 3A:
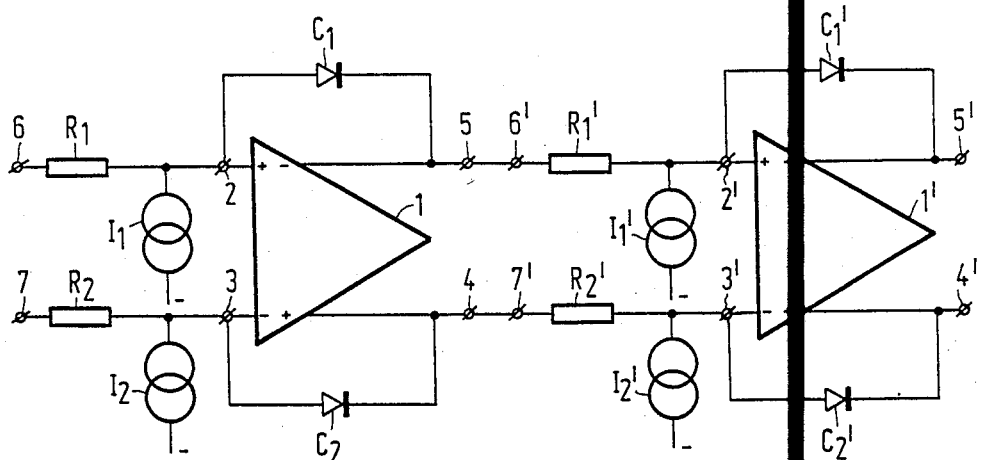
FIG. 3a shows two coupled filter arrangements in accordance with the invention.
Figure 3B:
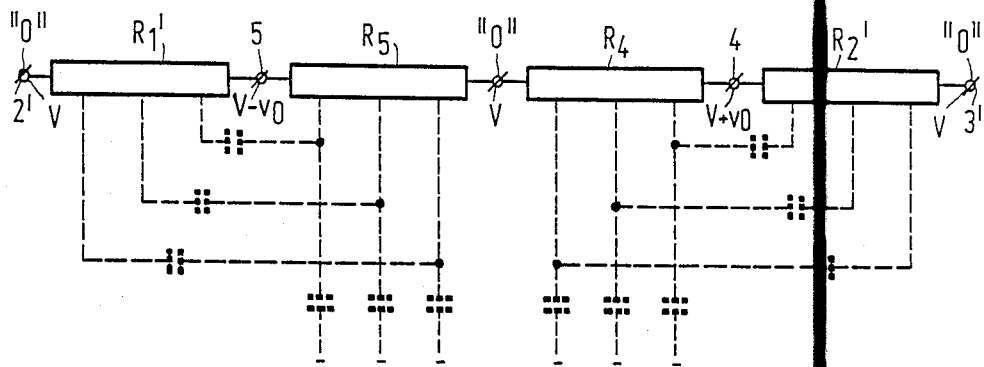

By way of illustration FIG. 3a shows two coupled filter arrangements in accordance with the invention. Identical parts bear the same reference numerals as in FIG. 1, the parts of the second filter arrangement being primed. The input terminals 6' and 7' of the second filter arrangement are connected to the output terminals 5 and 4 of the first filter arrangement. It is to be noted that alternatively the inputs of the second filter arrangement may be cross-coupled to the outputs of the first filter arrangement. If the amplifiers are constructed as shown in FIG. 2, regardless of how the entire filter arrangement is constructed, an input resistor and a load resistor are at any rate connected to each output. In FIG. 3b these resistors are shown separately. The load resistors $R_5$ and $R_4$ of the first filter arrangement have large resistance values relative to the input resistors $R_1'$ and $R_2'$ of the second filter arrangement, so that substantially the entire output signal current flows through the resistors $R_1'$ and $R_2'$. In order to obtain comparatively large RC-time constants, it is necessary to use comparatively large resistors $R_1'$ and $R_2'$. If these resistors are constructed as diffused bipolar resistors, they will behave as distributed RC networks as a result of the parasitic capacitances present between the resistors and the substrate. At higher frequencies this gives rise to a phase shift of the signal, which adversely effects the high-frequency characteristics of the filter arrangement. The influence of these parasitic capacitances can be reduced substantially if each of the resistors $R_1'$ and $R_2'$ is constructed as a diffused resistor and each of the resistors $R_4$ and $R_5$ is constructed as a buried resistor arranged in parallel therewith. As already stated, the junction point between the resistors $R_4$ and $R_5$ constitutes a virtual signal ground. The signal voltage on the non-inverting input 2' and the inverting input 3' is very small, so that these inputs may also be regarded as virtual signal grounds. Therefore, substantially the same signal voltage appears across the resistors $R_1'$ and $R_5$ and across the resistors $R_2'$ and $R_4$. As a result of this, there is hardly any signal voltage across the parasitic capacitances between the resistors $R_1'$ and $R_5$ and between the resistors $R_2'$ and $R_4$, so that these capacitances do not give rise to a phase shift of the signal. The parasitic capacitances between the buried resistor and the substrate hardly affect the behavior of the arrangement.

Figure 3C:
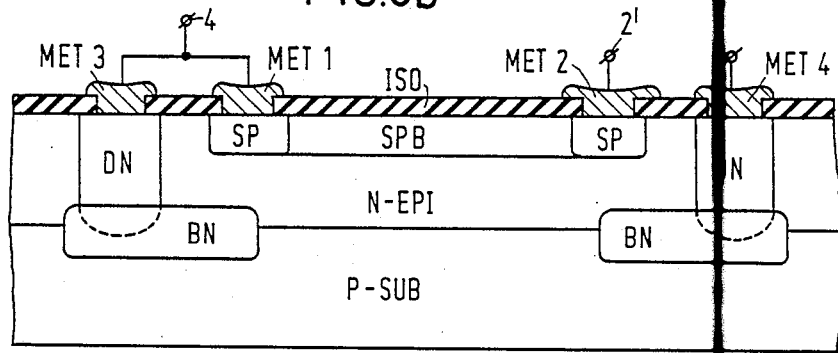
Figure 3D:
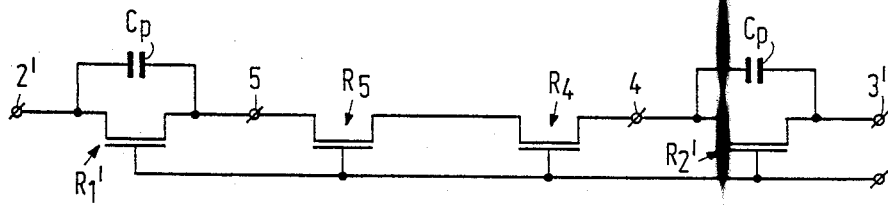

FIG. 3c is a diagrammatic sectional view of the integrated circuit for the set of resistors $R_4$ and $R_2'$. On a P-type substrate a P-SUB an N-type epitaxial layer N-EPI is deposited. In this layer a P-type diffused or implanted resistor SPB is formed with low-impedance end portions SP, constituting the resistor $R_2'$. Over this resistor, an insulating layer ISO is arranged, in which metallized apertures MET1 and MET2 are formed at the location of the resistor end portions SP. One terminal MET1 is connected to the output 4 of the first filter arrangement and the other terminal MET 2 is connected to the input 2' of the second filter arrangement. In the island beneath the resistor SPB a partly buried layer BN is formed. The high-impedance region N-EPI between the two portions of the buried layer BN constitutes the resistor $R_4$. In the insulating layer ISO two metallized apertures MET3 and MET4 are formed, which are each connected to one terminal of the resistor $R_4$ by means of a deep N-type diffusion DN and a portion of the buried layer BN. The terminal MET3 is connected to the output 4 of the first filter arrangement and the terminal MET 4 is connected to the junction point between the resistors $R_4$ and $R_5$.

If the filter resistors are constructed as diffused resistors the filter arrangement can be fabricated completely by means of a bipolar process. However, alternatively the filter arrangement may be fabricated in a BIMOS or BICMOS process. These are processes in which both bipolar transistors and MOS transistors can be fabricated. In the present example the junction capacities are constructed as bipolar PN junctions, while the resistors may then be constructed as MOS transistors. Such MOS transistors also exhibit parasitic capacitances which adversely affect the behavior of the filter arrangement. The channel-gate capacitance is the most important of these parasitic capacitances. This parasitic capacitance causes an MOS transistor to behave as a distributed RC-network in the same way as a diffused resistor, causing the signal to be phase-shifted. This phase shift can be compensated for by providing a compensation capacitor $C_p$ between the source and the drain of the transistor, as is shown in FIG. 3b. It is not necessary to arrange a compensation capacitor across the load resistors $R_4$ and $R_5$, because these resistors are not included in the signal path of the arrangement. For an optimum compensation the compensation capacitor has a value which is substantially equal to one sixth of the channel-gate capacitance.

The MOS resistors may have fixed resistance values, but it is alternatively possible to make their resistance values adjustable by means of a control voltage applied to the gate of the MOS transistor. The RC-time constant of such a filter arrangement can then be adjusted to the desired value both by adjusting the capacitance values of the junction capacitors and by adjusting the resistance values of the MOS-resistors. Preferably, the gates of the load resistors $R_4$ and $R_5$ are then connected to the gates of the resistors $R_1'$ and $R_2'$. When the control voltage varies the ratio between the resistance values $R_1'$, $R_2'$ and $R_4$, $R_5$ is maintained, so that the ratio between the signal currents through these resistors also remains constant.

Figure 3E:
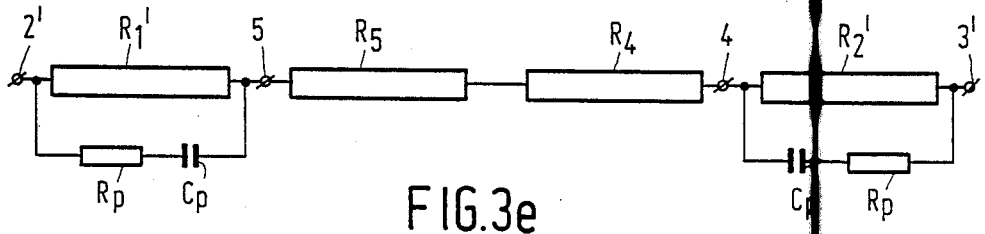

If the resistors are diffused resistors, the parasitic capacitances between these resistors and the substrate can be compensated for by arranging a compensation capacitor $C_p$ across the resistor. This compensation capacitor $C_p$ provides first-order compensation. As is shown in FIG. 3e, second-order compensation can be obtained by arranging a resistor $R_p$ in series with the capacitor $C_p$. Suitably, this resistor $R_p$ has a resistance value which is subsantially equal to 0.7×the resistance value of the resistor to be compensated.

The invention is not limited to the embodiments shown. Within the scope of the invention many variants are conceivable to those skilled in the art.

What is claimed is:

1. A filter arrangement comprising a balanced amplifier having an inverting input, a non-inverting input, an inverting output and a non-inverting output, at least a first input circuit arranged between a first input terminal and the inverting input, at least a second input circuit arranged between a second input terminal and the non-inverting input, a first feedback circuit arranged between the non-inverting output and the inverting input, and a second feedback circuit arranged between the inverting output and the non-inverting input, said first and second input circuits each comprising a substantially identical first circuit element and said first and second feedback circuits each comprising a substantially identical second circuit element, one of said two circuit elements being a capacitor and the other circuit element being a resistor, the magnitude of at least one of said two circuit elements being adjustable, characterized in that one circuit element comprises a junction capacitor and further comprising a bias-current source connected to the inverting input and to the non-inverting input for adjusting the capacitance of the junction capacitor connected to the relevant input.

2. A filter arrangement as claimed in claim 1, characterized in that the first circuit element is a junction capacitor and the second circuit element is a resistor.

3. A filter arrangement as claimed in claim 1 characterized in that the first circuit element is a resistor and the second circuit element is a junction capacitor.

4. A filter arrangement as claimed in claim 2, characterized in that the amplifier comprises two load resistors and two transistors of a first conductivity type which are arranged as a differential pair and which have their bases coupled to the non-inverting input and the inverting input of the amplifier, respectively, and their collectors coupled to the inverting output and the non-inverting output of the amplifier, respectively, between which outputs a load circuit is arranged, which load circuit comprises first and second current-source transistors of a second conductivity type, whose collectors are connected to the non-inverting output and the inverting output, respectively, whose bases are connected to a common control input which is coupled to a junction point between said two load resistors which are arranged between the non-inverting output and the inverting output.

5. A filter arrangement as claimed in claim 4, further comprising a second filter arrangement and characterized in that the input terminals of said second filter arrangement are connected to the outputs of the first filter arrangement and in that a resistor arranged in an input circuit of the second filter arrangement and the load resistor which forms part of the first filter arrangement and which is connected to said resistor in the input circuit are integrated in one semiconductor body, respectively, as a diffused resistor and a buried resistor arranged in parallel therewith.

6. A filter arrangement as claimed in claim 1, 2, 3 or 4, characterized in that a compensation capacitor is arranged in parallel with the resistors in one of the input circuits and the feedback circuits.

7. A filter arrangement as claimed in claim 6, characterized in that the compensation resistor is arranged in series with the compensation capacitor.

8. A filter arrangement as claimed in claim 6, characterized in that the resistors are one of diffused or implanted resistors.

9. A filter arrangement as claimed in claim 6, characterized in that resistors are MOS resistors.

* * * * *